Jan. 17, 1967 R. M. WARNER, JR., ETAL 3,299,291
LOGIC ELEMENTS USING FIELD-EFFECT TRANSISTORS
IN SOURCE FOLLOWER CONFIGURATION
Filed Feb. 18, 1964

INVENTORS
Raymond M. Warner Jr.
BY Geza Csanky
Mueller & Aichele
Attys.

United States Patent Office 3,299,291
Patented Jan. 17, 1967

3,299,291

LOGIC ELEMENTS USING FIELD-EFFECT TRANSISTORS IN SOURCE FOLLOWER CONFIGURATION

Raymond M. Warner, Jr., Scottsdale, and Geza Csanky, Mesa, Ariz., assignors to Motorola, Inc., Chicago, Ill., a corporation of Illinois Filed Feb. 18, 1964, Ser. No. 345,667
6 Claims. (Cl. 307—88.5)

This invention relates to logic elements, and in particular to logic circuit elements employing field-effect transistors.

A logic element is herein defined as a specific combination of individual circuit components to provide an output capable of rapid transition between two discrete voltage levels in response to a change in the voltage level of one or more inputs. Such elements, when appropriately fed with one or with a plurality of inputs provide a single output, thereby functioning as a buffer or functioning to perform AND, NAND, OR and NOR logic operations as may be required by an overall symbolic logic system.

For a logic element of the type under consideration to approach ideal conditions, it is desirable that its output change states or switch between two discrete voltage levels in response to a small change in input voltage level, and that this switching occur near the middle of the range of input voltage levels. In addition, the logic element should exhibit high input impedance and low power drain, and be capable of receiving a number of direct coupled inputs without experiencing D.C. offset. It is also desirable that the logic element have a good frequency response so that it may be cascaded without deterioration in switching performance, and for many applications should be capable of sharp, step-like output transitions so that a switching speed-up effect is realized.

In addition to having the above described electrical properties, a further consideration for a present day logic element is that it employs semiconductor devices as its active components and resistances as its passive components, requiring no inductors or capacitors, so that it may be readily integrated into a substrate of semiconductor material. The circuit configuration making up the logic element should be simple and readily arranged so that circuit integration can be achieved by epitaxial and diffusion techniques. To this end it is known, for example, that field-effect transistors are easier to integrate than conventional transistors in that current flow therein is parallel to rather than normal to the major surfaces of the semiconductor substrate or wafer. An additional advantage is the fact that an integrated circuit logic element can be fabricated using field-effect transistors of any type, including isolated gate field-effect transistors.

It is therefore a general object of the present invention to provide improved logic elements.

Another object of the invention is to provide improved logic elements exhibiting the foregoing desirable electrical properties.

A further object is to provide improved logic elements that may be readily fabricated by integrated circuit techniques.

Still another object is to provide improved logic elements which may be of the inverting or non-inverting type, and which may be readily incorporated with a number of inputs to perform desired AND, OR, NAND and NOR logical functions.

A more specific object of the invention is to provide improved logic elements having a field-effect transistor with a semiconductor current-limiter load to provide switching action, and which is driven by a source follower field-effect transistor to allow direct coupling of a plurality of inputs and to provide a high input impedance and a low output impedance.

Briefly, the logic elements of the present invention comprise a switching arrangement including a field-effect transistor with a semiconductor nonlinear resistance device as a current-limiter load. The current-limiter load is a self-biased field-effect transistor (or a field-effect diode) having a drain current ($I_D$) different from that of the first field-effect transistor. Varying the point of intersection between the current-voltage characteristics of the first field-effect transistor and the load line presented by the current-limiter load in response to an input voltage produces a rapid transition between widely separated output voltage levels.

By driving the above field-effect transistor and current-limiter load combination from an impedance transforming source, such as an additional field-effect transistor connected in a source follower configuration, frequency response is enhanced so that a number of logic elements may be cascaded without deterioration of switching performance, and a number of inputs may be direct current coupled without causing offset. The manner in which the source follower field-effect transistor is coupled to the basis field-effect transistor and current-limiter load arrangement allows either a non-inverting or an inverting output to be produced. Thus a combination of a field-effect transistor with a current-limiter load, and having a source follower field-effect transistor input, provides a basic logic element which may be used as a snap-action buffer, or which may be provided with an number of inputs for performing AND, OR, NAND and NOR logic functions.

The foregoing and other objects, features and attending advantages of the invention will become apparent from the following description of preferred embodiments when considered in conjunction with the accompanying drawings, in which.

Figure 1:
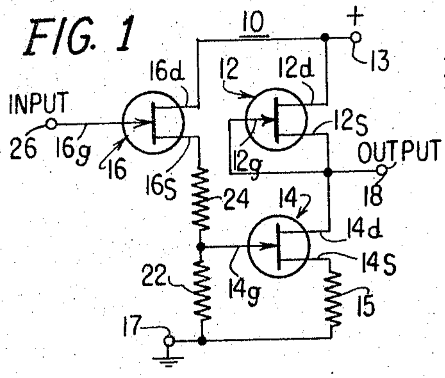
FIG. 1 is a circuit diagram of an inverting logic element according to the invention.

In FIG. 1 the inverting logic element shown at 10 includes field-effect (or unipolar) transistors 12, 14 and 16. Transistors of this type are known in the art and may briefly be described as a three-electrode semiconductor device having charged carriers of one polarity only, and wherein a signal applied to an input or control electrode modulates the electric field applied to a conducting channel to result in a variation in the effective cross-sectional area of the channel. The field-effect transistor is considered a high impedance or voltage device rather than a low impedance or current device as in the case of conventional transistors, and in some applications it provides characteristics similar to those of vacuum tube pentodes. According to accepted nomenclature the three electrodes of a field-effect transistor are designated the gate (input), drain (output) and source (common) electrodes, and are identified by the numerals having the subscripts *g*, *d*, and *s*, respectively, in the circuit of FIG. 1.

The drain electrode $\mathbf{12}_d$ of transistor 12 is connected to a source of positive potential at terminal 13, and its source electrode $12_s$ is connected to drain electrode $14_d$ of transistor 14. The source electrode $14_s$ of transistor 14 is returned through resistor 15 to a negative potential or to ground reference potential at terminal 17. With terminal 17 connected to ground as shown positive logic results, as hereinafter described. Gate electrode $12_g$ of transistor 12 is returned to its source electrode $12_s$, which point is further connected to output terminal 18. Gate electrode $14_g$ of transistor 14 receives an input voltage from the junction point between resistors 22 and 24, which resistors are series connected between source electrode $16_s$ of transistor 16 and terminal 17. Drain electrode $16_d$ of transistor 16 is returned to the positive potential at terminal 13, and its gate electrode $16_g$ is connected to input terminal 26.

Thus in the above described circuit, field-effect transistor 14 is controlled by transistor 16, and further has transistor 12 connected as a current-limiter load for its drain current. Transistor 16, in turn, is connected in a source follower or source output configuration. This connection is analogous to an emitter follower convention transistor circuit, or a cathode follower vacuum tube circuit, and may be considered an impedance transformer having a voltage gain less than unity. Field effect transistor 12, with its gate electrode connected to its source electrode in a self-biasing arrangement to result in an effective two-terminal or diode configuration having a nonlinear resistance characteristic, provides a semiconductor current-limiter load for field-effect transistor 14. A current-limiter of this type is described in an article by R. M. Warner, Jr., et al. entitled: A Semiconductor Current Limiter, Proceedings of the IRE, volume 47, pages 44–56, January 1959.

For the N-type channel field-effect transistors shown and with the drain electrode connected to a positive voltage and the source electrode returned to ground potential, the drain current ($I_D$) will become constant at a lower value in response to a negative-going voltage applied to its gate electrode. The value of drain voltage ($V_D$) at which $I_D$ becomes constant is defined as the pinch-off voltage ($V_P$). It is to be understood, however, that P-type channel field-effect transistors may also be used, with appropriate polarity reversals, to produce the same operation.

Figure 2:
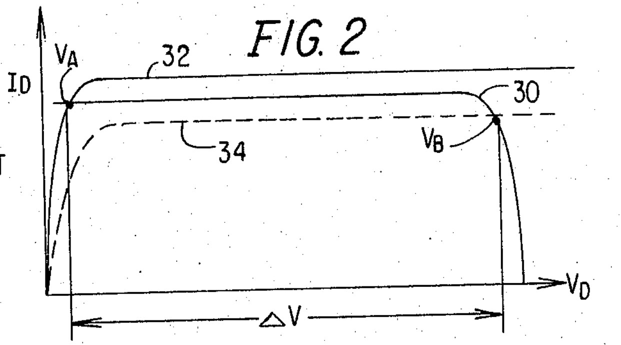
FIGS. 2 and 3 are curves useful in understanding the operation of the circuit of FIG. 1.
Figure 3:
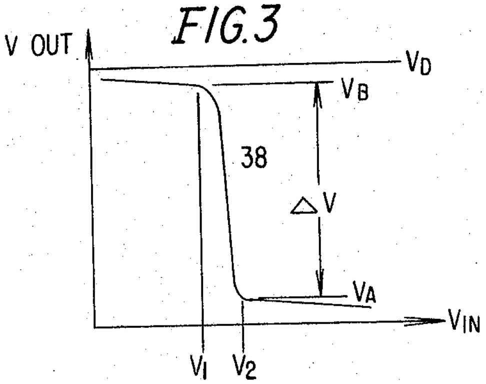

Referring now to FIGS. 2 and 3, there is illustrated the manner in which the load line of current-limiter field-effect transistor 12 and the characteristics of field-effect transistor 14 interact to provide the desired switching action (FIG. 2), and the resulting output voltage versus input voltage curve (FIG. 3) for logic element 10. In the current-voltage curves of FIG. 2 the drain current ($I_D$) for transistor 12, connected as a self-bias current-limiter, provides the load line represented by curve 30. By biasing drain electrode of transistor 12 beyond pinch-off, $I_D$ remains constant until a sufficiently high value of $V_D$ is reached to cause avalanche breakdown. This operation is represented by curve 30, which may be considered a load line for transistor 14. Transistor 14 is operated in a normal mode so that pinch-off occurs at a value $V_D$ determinable by the voltage level of its gate electrode, with constant $I_D$ thereafter. Thus, one level of constant $I_D$ for transistor 14 is shown by curve 32, and a second level of constant $I_D$ (caused by a negative-going gate signal) is shown by curve 34. The output signal at terminal 18 exists at the level of $V_D$ at which the $I_D$ vs. $V_D$ curves of transistor 14 cross load line 30 of transistor 12. Thus for one input level of transistor 14 (as, for example, at zero or ground level representing binary "0" appled to terminal 26) the voltage appearing at terminal 18 will be $V_B$. Applying a positive-going voltage (for example, plus 10 volts representing binary "1") to terminal 26 applies a positive gating voltage (e.g., plus 3 volts) to transistor 14 to raise its drain current ($I_D$). This in turn moves the characteristic curve of transistor 14 from curve 34 to curve 32. The voltage appearing at terminal 18 will then be $V_A$. There is accordingly a voltage transition at terminal 18 of $\Delta V = V_A - V_B$. It can be seen from FIG. 3, wherein curve 38 is a plot of output voltage versus input voltage for logic element 10, that this transition is in output voltage very sharp to provide a step-like change in output voltage level in response to a slight change in input voltage from $V_1$ to $V_2$. Because the output voltage can exist only at two discrete levels a snap-action takes place and switching is faster than the rise-time of the input voltage. For example, assuming a sinusoidal input, switching time $\tau$ is a constant percentage of the time of a complete cycle $1/f$ and the product $\tau$ $(1/f)$ is constant over the operational frequency range of logic element 10, allowing a drive up to hundreds of kilocycles.

As mentioned, input voltages are applied to transistor 14 via source follower stage 16 rather than directly to the gate electrode of transistor 14. The source follower input stage has a voltage gain of less than unity so that the equivalent Miller effect capacitance (or gate-drain capacitance) does not have a significant effect on the frequency response of the switching action. This enables a number of logic elements to be cascaded without deterioration in switching performance of the overall system. Thus, in FIG. 1 the input to transistor 14 is developed by the voltage divider consisting of resistors 22 and 24, connected in the source return of transistor 16. Resistor 15 maintains the source electrode $14_s$ of transistor 14 above the potential at terminal 17. This arrangement avoids D.C. offset for direct-coupled input voltages. With terminal 26 at a zero volt level the impedance of transistor 16 is high and transistor 14 is biased non-conducting by the voltage developed in the voltage divider consisting of resistors 22 and 24. A positive-going voltage applied to terminal 26 decreases the resistance of transistor 16, thus driving gate electrode $14_g$ of transistor 14 more positive to raise its drain current. This in turn drives output terminal 18 negative, from $V_B$ to $V_A$ in FIG. 2, and there is a phase inversion between the voltage applied to terminal 26 and the voltage derived from terminal 18. With +10 volts applied to terminal 13 and terminal 17 at ground, and with the input voltage level at terminal 26 either at +10 volts or at ground (representing binary "1" and binary "0" respectively) a positive voltage swing of approximately 10 volts may be derived from output terminal 18. This results in positive logic, although it is to be understood that negative logic may also be obtained when proper polarities are observed.

Figure 4:
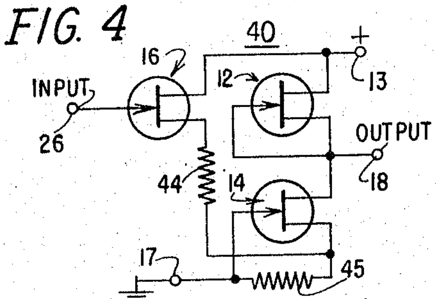
FIG. 4 is a circuit diagram of a non-inverting logic element according to the invention.

In FIG. 4, wherein like reference numerals refer to like circuit elements as FIG. 1, the non-inverting logic element 40 is provided by modifying the manner in which the source follower transistor 16 controls field-effect transistor 14 in response to a change in the input voltage level appearing at terminal 26. In this embodiment, the source electrode of transistor 16 is connected to the source electrode of transistor 14 by resistor 44. The source electrode of transistor 14 is returned by resistor 45 to ground reference potential at terminal 17. The gate electrode of transistor 14 is also returned to terminal 17. In operation, when a zero input voltage level is present at terminal 26 transistor 16 provides a current path through resistors 44 and 45. The difference of potential developed across resistor 45 provides a gate-to-source bias on transistor 14 that results in the $I_D$ characteristic shown by curve 32 of FIG. 2. Accordingly, the output voltage level at terminal 18 will be $V_A$. A positive-going voltage applied to input terminal 26 decreases the impedance of transistor 16 and results in an increase in the voltage drop across resistor 45, causing transistor 14 to pinch-off at a lower level. This in turn results in the $I_D$ characteristic shown by curve 34 of FIG. 2, and the output voltage level at terminal 18 is switched to $V_B$. It can be seen that, in contrast with the circuit of FIG. 1 wherein the voltage at terminal 18 goes from $V_B$ to $V_A$ for a positive-going input voltage, the voltage at terminal 18 in FIG.

4 goes from $V_A$ to $V_B$, and $\Delta V=-(V_A-V_B)$. Thus, for a positive-going input at terminal 26 the output at terminal 18 swings in the same direction and there is no phase inversion. This feature is extremely useful where the logic element of the invention is used as a buffer for cascading a number of stages in that signal polarity is preserved.

Figure 5:
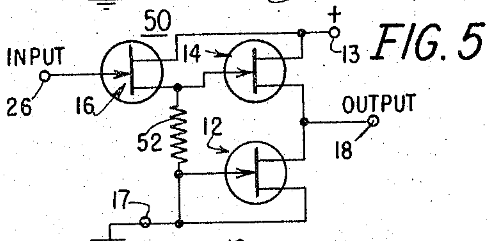
FIG. 5 is a circuit diagram of another embodiment of a non-inverting logic element according to the invention.

There are also many instances where a simple non-inverting logic element is required, but where it is not essential to provide as much speed-up in the transition of the output voltage levels. Such elements can be used to follow a logic element having switching speed-up, and with adequate frequency response signal fidelity is maintained and the performance of the overall system will not be deteriorated. One such switching element 50 is shown in FIG. 5, wherein like reference numerals refer to like circuit elements as in FIGS. 1 and 4. In the circuit of FIG. 5 the drain electrode of field-effect transistor 14 is connected to a positive voltage at terminal 13, and its source electrode to a drain electrode of transistor 12. The source electrode of transistor 12 is returned to ground reference potential and its gate electrode is connected to its source electrode to provide a current-limiter load for field-effect transistor 14 in the manner previously described. Source follower transistor 16 has its drain electrode connected to terminal 13 and its source electrode to the gate electrode of transistor 14. The source electrode of transistor 16 is also returned to ground by resistor 52 to terminal 17. Transistor 16 and resistor 52 provide a voltage dividing action to supply bias to the gate electrode of transistor 14. With transistor 16 in the high impedance state (as, for example, with a zero voltage level applied to terminal 26) transistor 14 is biased non-conducting and a low voltage level appears at terminal 18. A positive-going voltage level at terminal 26 tends to make transistor 16 conducting to decrease its impedance, causing the gate electrode of transistor 14 to swing in a positive direction. This tends to make transistor 14 conduct to decrease its impedance, and the voltage at terminal 18 also swings in a positive direction. With transistor 12 providing a current-limiter load of the type previously discussed, the voltage level at terminal 18 swings between $V_A$ and $V_B$ (FIG. 2), but at a somewhat slower speed than in the previously discussed circuits since the output voltage transition tends to follow the input voltage transition. However, there is no pulse degeneration, input impedance is high, and output impedance is low so that the logic element 50 provides an excellent buffer.

Figure 6:
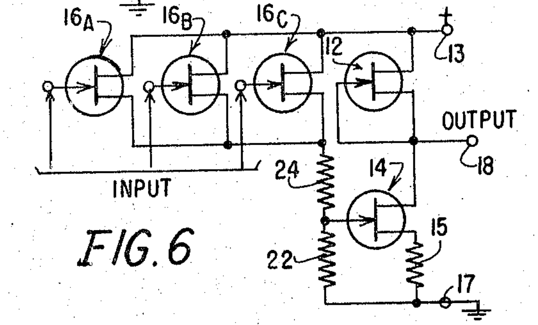
FIGS. 6 and 7 are schematic diagrams of the manner in which the logic elements of the invention may be modified to perform various logic functions.
Figure 7:
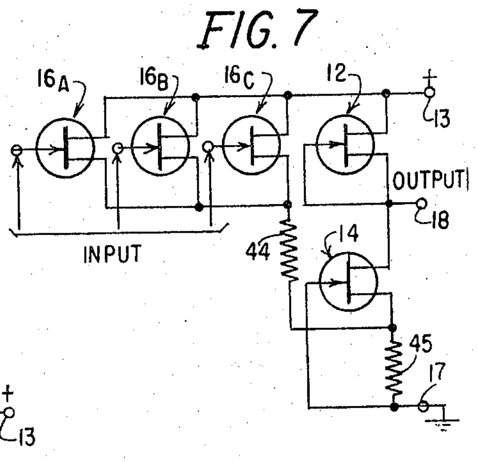

With the foregoing principles of operation in mind, the following illustrative embodiments show the manner in which the logic elements of the invention may be employed to perform logic functions. For example, a plurality of source follower input transistors 16A, 16B and 16C may be connected in parallel as shown in FIGS. 6 and 7 to perform prescribed logic functions. The total current of transistors 16A, 16B and 16C develop the input voltage of transistor 14 in the voltage divider of resistors 22 and 24 in the inverting embodiment of FIG. 6, and across resistor 45 in the non-inverting embodiment of FIG. 7. Transistors 16A, 16B and 16C are arranged so that with a zero level input voltage (or binary "0") at all of their gate electrodes (and all in a high impedance state) the drain current of transistor 14 is at a level 34 of FIG. 2 (binary "1" out) for the inverting embodiment of FIG. 6, and the drain current of transistor 14 is at a level 32 (binary "0" out) for the non-inverting embodiment of FIG. 7. If transistors 16A, 16B and 16C are selected so that it requires a positive-going signal (binary "1") to all their gate electrodes to cause curve 32 or curve 34 to cross load line 30, NAND and AND logic is possible. In the inverting embodiment of FIG. 6 NAND logic results and in the non-inverting embodiment of FIG. 7 AND logic results. If, on the other hand, transistors 16A, 16B and 16C are selected so that it requires a positive-going signal (binary "1") to only one gate electrode to cause curve 32 or curve 34 to cross load line 30, NOR logic and OR logic is possible. In the inverting embodiment of FIG. 6 NOR logic results and in the non-inverting embodiment of FIG. 7 OR logic results.

Figure 8:
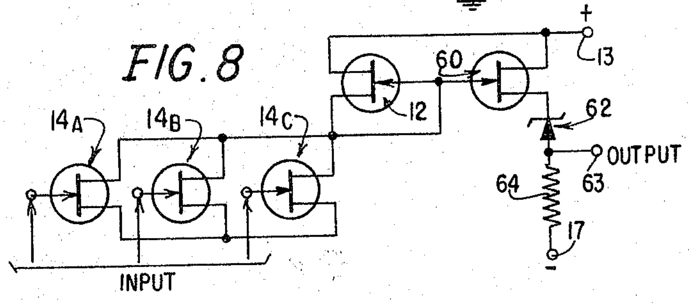
FIG. 8 is a schematic representation of an additional embodiment of the invention for performing logic functions, and particularly adapted for high fan-in and fan-out.

A further illustrative embodiment of NAND and NOR logic elements according to the invention, and particularly adapted to provide high fan-in and fan-out, is shown in FIG. 8. A number of field-effect transistors 14A, 14B and 14C are connected in parallel and their total drain current is varied with respect to the load line provided by current-limiter transistor 12. It is to be understood that a number of field-effect transistors 14, greater than the three illustrated, may be utilized. Transistors 14A, 14B and 14C are selected so that when all receive a zero input voltage level at their gate electrode (binary "0") the total drain current is at the level of curve 34 (FIG. 2), and with any one receiving a positive-going input at its gate electrode (binary "1") the total drain current rises to the level of curve 32. In this arrangement NOR logic results. Alternately, by selecting transistors 14A, 14B and 14C so that total drain current is at the level of curve 34 when a zero input voltage level supplied to the gate electrode of any one, and at the level of curve 32 with all transistors receiving a positive-going input voltage, NAND logic results. This circuit arrangement eliminates the voltage dividing resistors supplying pinch-off voltage to the gate electrode of a single transistor 14 in the embodiment of FIGS. 6 and 7, which arrangement is a limiting factor to be considered for fan-in.

High fan-out may be achieved in the embodiment of FIG. 8 by further adding a source follower output stage. To this end, the drain electrode of field-effect transistor 60 is connected to the positive voltage at terminal 13, and its gate electrode connected to the commonly connected drain electrodes of transistors 14A, 14B and 14C. The source of electrode transistor 60 is returned to the negative voltage at terminal 17 by a load arrangement including zener diode 62 and resistor 64. Terminal 68 is connected to the common point between zener diode 62 and resistor 64 to provide an output terminal. Zener diode 62 acts as a level-translator voltage buffer so that full output voltage swing may be obtained at terminal 68. Because of the low output impedance provided by source follower output transistor 60, the circuit of FIG. 8 produces a logic element having extremely high fan-out capabilities.

While certain preferred embodiments of the invention have been described, other modifications thereof will be apparent to those skilled in the art and the above description and accompanying drawings shall be interpreted as illustrative and not limiting.

What is claimed is:

1. A logic element including in combination, first, second and third field-effect transistors each having drain, source and gate electrodes, means connecting the drain electrode of said first field-effect transistor to the source electrode of said second field-effect transistor, first resistor means connecting the source electrode of said first field-effect transistor to a first voltage source, means connecting the drain electrode of said second field-effect transistor to a second voltage source, means connecting the source electrode of said second field-effect transistor to its gate electrode, means connecting the drain electrode of said third field-effect transistor to said second voltage source, second resistor means connecting the source electrode of said third field-effect transistor to the gate electrode of said first field-effect transistor, third resistor means connecting the gate electrode of said first field-effect transistor to said first voltage source, at least one input terminal connected to the gate electrode of said third field-effect transistor, and an output terminal connected to the drain electrode of said first field-effect transistor.

2. A logic element including in combination, first, second and third field-effect transistors each having drain, source, and gate electrodes, means connecting the drain electrode of said first field-effect transistor to the source electrode of said second field-effect transistor, first resistor means connecting the source electrode of said first field-effect transistor to a first voltage source, means connecting a drain electrode of said second field-effect transistor to a second voltage source, means connecting the source electrode of said second field-effect transistor to its gate electrode, means connecting the drain electrode of said third field-effect transistor to said second voltage source, second resistor means connecting the source electrode of said third field-effect transistor to the source electrode of said first field-effect transistor, means connecting the gate electrode of said first field-effect transistor to said first voltage source, at least one input terminal connected to the gate electrode of said third field-effect transistor, and an output terminal connected to the drain electrode of said first field-effect transistor.

3. A logic element including in combination, first, second and third field-elect transistors each having drain, source, and gate electrodes, means connecting the source electrode of said first field-effect transistor to drain electrode of said second field-effect transistor, means connecting the drain electrode of said first field-effect transistor to a first voltage source, means connecting the source electrode of said second field-effect transistor to a second voltage source, means connecting the gate electrode of said second field-effect transistor to its source electrode, means connecting the drain electrode of said third field-effect transistor to the first voltage source, means connecting the source electrode of said third field-effect transistor to the gate electrode of said first field-effect transistor, resistor means connecting the source electrode of said third field-effect transistor to said second voltage source, at least one input terminal connected to the gate electrode of said third field-effect transistor, and an output terminal connected to the source electrode of said first field-effect transistor.

4. A logic element including, in combination: a first field-effect transistor having source, gate and drain electrodes with said gate electrode connected to said source electrode, a second field-effect transistor having source, gate and drain electrodes with the drain electrode thereof connected to the source electrode of said first field-effect transistor, said drain electrode of said first field-effect transistor connectable to a voltage supply and said source electrode of said second field-effect transistor resistively connected to a point of reference potential, an input source follower field-effect transistor having source, gate and drain electrodes, with the drain electrode thereof connectable to said voltage supply and the gate electrode thereof connected to an input terminal for receiving binary logic signals, said source electrode of said source follower resistively connected to the gate electrode of said second field-effect transistor for providing a voltage change at the gate electrode of said second field-effect transistor in response to changes in the voltage level of binary logic signals at said input terminal, thereby providing a substantial change in the output signal at said drain electrode of said second field-effect transistor.

5. The logic element of claim 4 wherein said second field-effect transistor has a first discrete level of drain voltage corresponding to a first level of input voltage and operative to produce a second discrete level of drain voltage in response to a small deviation in level of voltage applied to the gate electrode thereof, said second discrete level of drain voltage being substantially less than said first discrete level of drain voltage, said binary logic signals applied to said source follower field-effect transistor producing said small deviation at the gate electrode of said second field-effect transistor.

6. A logic element including, in combination: a first field-effect transistor having source, gate and drain electrodes with said gate electrode connected to said source electrode and said drain electrode connectable to a voltage supply, a second field-effect transistor having source, gate and drain electrodes with the drain electrode thereof connected to the source electrode of said first field-effect transistor, said source electrode of said second field-effect transistor resistively connected to a point of reference potential, an input source follower field-effect transistor having source, gate and drain electrodes with the drain electrode thereof connectable to said voltage supply and the gate electrode thereof connected to an input terminal for receiving binary logic signals, said source electrode of said source follower field-effect transistor resistively connected to the source electrode of said second field-effect transistor and said gate electrode of said second field-effect transistor connected to a point of reference potential, said binary logic signals at said input terminal providing a voltage variation at the source electrode of said second field-effect transistor and producing relatively large change in voltage level at the drain electrode of said second field-effect transistor, said change in voltage level at said drain electrode of said second field-effect transistor being in the same direction as the change in the signals applied to said input terminal.

References Cited by the Examiner

UNITED STATES PATENTS

| | | | |
|---|---|---|---|
| 3,058,007 | 10/1962 | Lynch | 307—88.5 |
| 3,100,838 | 8/1963 | Szekely | 307—88.5 |
| 3,135,926 | 6/1964 | Bockemuel | 307—88.5 |

OTHER REFERENCES

Field Effect Transistor Theory and Application Notes No. 2, June 1962, Amelco, published by Semiconductor Division of Teledyne, Inc.

ARTHUR GAUSS, *Primary Examiner.*

B. P. DAVIS, *Assistant Examiner.*